United States Patent [19]
Lee et al.

[11] Patent Number: 5,913,114
[45] Date of Patent: Jun. 15, 1999

[54] METHOD OF MANUFACTURING A SEMICONDUCTOR DEVICE

[75] Inventors: Sun-Hak Lee; Chang-Ki Jeon; Cheol-Joong Kim, all of Bucheon-si, Rep. of Korea

[73] Assignee: Samsung Electronics Co., Ltd., Suwon, Rep. of Korea

[21] Appl. No.: 09/007,534

[22] Filed: Jan. 15, 1998

[30] Foreign Application Priority Data

Jan. 23, 1997 [KR] Rep. of Korea ......................... 97-1937

[51] Int. Cl.[6] ............................................... H01L 21/8238
[52] U.S. Cl. ........................... 438/202; 438/268; 438/275
[58] Field of Search ................................... 438/268, 275, 438/135, 585, 202, 234

[56] References Cited

U.S. PATENT DOCUMENTS

| | | | |
|---|---|---|---|
| 4,806,500 | 2/1989 | Scheibe | 438/275 |
| 5,340,756 | 8/1994 | Nagayasu | 438/202 |
| 5,441,903 | 8/1995 | Eklund | 438/207 |
| 5,541,125 | 7/1996 | Williams et al. | 438/202 |
| 5,851,864 | 12/1998 | Ito et al. | 438/202 |

*Primary Examiner*—Tuan H. Nguyen
*Attorney, Agent, or Firm*—Jones Volentine, L.L.P.

[57] ABSTRACT

A semiconductor device, and a method of manufacturing the same, containing a high voltage DMOS transistor, a low voltage CMOS transistor, and a bipolar transistor in a single substrate. The steps include forming an isolation layer within the substrate in an isolation region between each of a DMOS region, a CMOS region, or a bipolar region. A first oxide layer of variable thickness is formed on the substrate, a thick second oxide layer is formed on the isolation layer, and a polysilicon layer is formed on both oxide layers. The polysilicon layer is patterned to form gate patterns on the first oxide layer and resistive patterns on the second oxide layer. The gate pattern is then doped but the resistive pattern is undoped. The thickness of the first oxide layer in the DMOS region is greater than the thickness of the first oxide layer in the CMOS region.

10 Claims, 14 Drawing Sheets

METHOD OF MANUFACTURING A SEMICONDUCTOR DEVICE

BACKGROUND OF THE INVENTION

1. Field of the Invention

The present invention relates to a semiconductor device and a method of manufacturing the same, and more specifically, to a semiconductor device that has a DMOS (diffused metal-oxide semiconductor), a CMOS (complementary metal-oxide semiconductor) and a bipolar transistor on a single substrate, and a method of manufacturing the same.

2. Description of the Related Art

Compact, integrated semiconductor devices can be made cheaper and more reliable by forming several different components on a single substrate. Such integrated devices have many merits, including the reduction of the response time of a circuit and the reduction of the signal transfer time between circuits. Furthermore, very compact, highly integrated circuits are necessary in many fields of research and development, especially for aircraft and space vehicles in which total mass and volume are very constrained for both the vehicle and the payload. More generally, integrated devices are used to manufacture cheaper and more reliable consumer electronics.

FIG. 1 illustrates a conventional semiconductor device which has a bipolar transistor, a DMOS transistor and a CMOS transistor on a single p type substrate 100, defining three corresponding transistor regions, i.e., a bipolar region, a DMOS region and a CMOS region. The substrate 100 is a p– silicon substrate having a plurality of doped regions, insulating layers, and conductors.

The transistor regions have in common the p– substrate 100 and an n type epitaxial layer 120 that is 20 μm thick. The three transistor regions are separated by p+ isolation layers 170 which extend from the surface of the epitaxial layer 120 to the p– substrate 100. The surface of the epitaxial layer 120 is covered with an oxide layer 150 having a plurality of contact holes.

In the bipolar transistor region, an n+ buried layer 110 is formed between the substrate 100 and the epitaxial layer 120, and an n+ sink layer 140 is formed in the epitaxial layer 120 and extends from the surface of the epitaxial layer 120 to the n+ buried layer 110. A p– type base 122 is formed in the epitaxial layer 120, and an n+ emitter 128 and two p+ type bases 127 are formed in the p– type base 122. The oxide layer 150 has contact holes on the emitter 128 and the two p+ bases 127. An emitter electrode E is in contact with the emitter 128, and two base electrodes B are in contact with the two p+ bases 127 through the contact holes.

In the DMOS transistor region, an n+ buried layer 110 is formed between the p-type substrate 100 and the n type epitaxial layer 120. Two p type wells 123 are formed in the n type epitaxial layer 120, and n type sources 124 are formed in the respective p type wells 123. An n+ sink layer 140 is formed in the epitaxial layer 120 and extends from the surface of the epitaxial layer 120 to the n+ buried layer 110, and a drain electrode D is formed thereon. Source electrodes S are formed on the respective sources 124. A gate oxide layer 161 is formed on the surface of the epitaxial layer 120 between the sources 124, and a gate electrode G is formed on the gate oxide layer 161.

The CMOS transistor region is divided into an NMOS region and a PMOS region, and an n channel MOS transistor and a p channel MOS transistor are formed in the respective regions. A p– type well 121 is formed in the n type epitaxial layer 120 of the NMOS transistor region, and n+ type source 125 and drain 126 are formed in the p– type well 121. In the PMOS transistor region, p+ type source 129 and drain 130 are formed in the epitaxial layer 120. Source electrodes S are formed on the sources 125 and 129 and drain electrodes D are formed on the drains 126 and 130. A gate oxide layer 162 is formed on the surface of the p– type well 121, between the source 125 and drain 126 of the NMOS region. Another gate oxide layer 162 is formed on the surface of the epitaxial layer 120 between the source 129 and drain 130 of the PMOS region. Gate electrodes G are formed on the gate oxide layers 162. The gate oxide layers 162 of the CMOS region have the same thickness as the gate oxide layer 161 of the DMOS region since the gate oxide layers 161 and 162 are formed in the same process.

In the conventional semiconductor device shown in FIG. 1, resistance elements are not shown since they are formed in separate steps, making the manufacturing process more complicated.

In addition, the circuit does not have different withstand voltages for the different transistors because the thicknesses of the gate oxide layers in the different region are the same. Therefore the circuits are not reliable when some transistors (e.g., the DMOS transistors) are used at higher operating voltages.

SUMMARY OF THE INVENTION

It is therefore an object of the present invention to improve the reliability of a semiconductor device which has both high voltage elements and low voltage elements in the same circuit.

It is another object of the present invention to form semiconductor devices and resistance elements using the same process.

These and other objects, features and advantages are provided, according to the present invention, by a semiconductor device having gate insulating layers of different thicknesses, and polysilicon resistive elements formed on local oxide layers separating the transistors.

The method of manufacturing the semiconductor device containing a DMOS transistor, a CMOS transistor and a bipolar transistor in a single substrate, includes forming an isolation layer within a substrate in an isolation region disposed between any two of a DMOS region, a CMOS region, and a bipolar region. A first oxide layer of variable thickness is formed on the substrate, and a second oxide layer is formed on the isolation layer. A polysilicon layer is deposited on the oxide layers and is patterned to form gate patterns on the first oxide layer and resistive patterns on the second oxide layer. Then the gate pattern is doped.

In a further aspect of the method the first oxide layer is formed with greater thickness in the DMOS region than in the CMOS region.

The semiconductor device of the invention includes an isolation layer formed within a substrate in an isolation region disposed between any two of a DMOS region, a CMOS region, and a bipolar region. The device includes a thick oxide layer on the isolation layer, and a polysilicon resistance element on the thick oxide layer.

In another aspect of the invention, the resistance element is undoped. In still another aspect of the invention, the device also has another oxide layer with a first gate oxide layer on the substrate in the DMOS region, and a second gate oxide layer on the substrate in the CMOS region, where the first gate oxide layer is thicker than the second gate oxide layer.

BRIEF DESCRIPTION OF THE DRAWINGS

The foregoing and other objects, aspects and advantages will be described with reference to the drawings, in which.

DETAILED DESCRIPTION OF THE INVENTION

Figure 1:
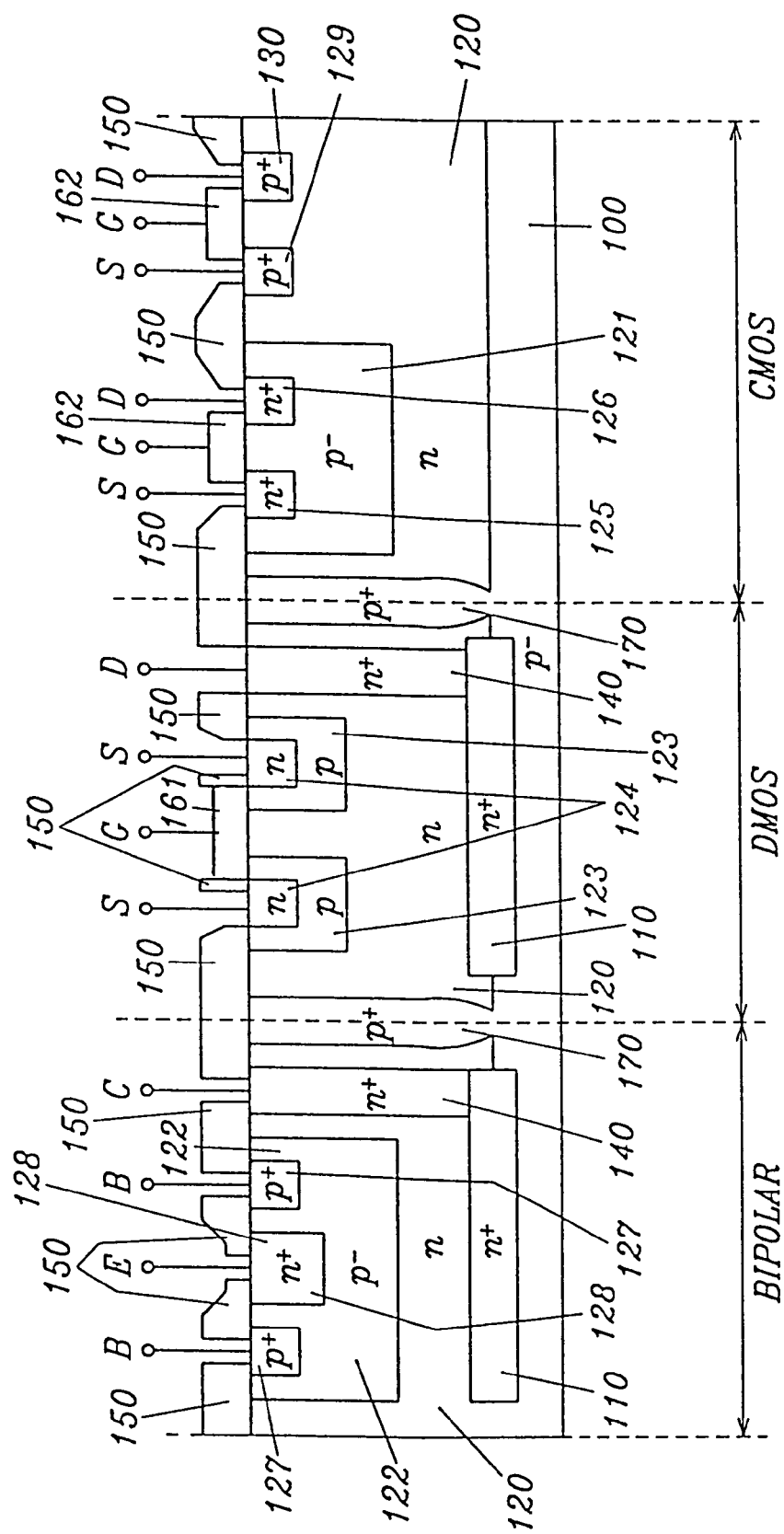
FIG. 1 is a schematic cross-section of a conventional semiconductor device.

The present invention will now be described more fully hereinafter with reference to the accompanying drawings, in which preferred embodiments of the present invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity, and the same numerals represent identical structures throughout the figures.

In FIG. 2 through FIG. 14 a p type substrate 10 is considered to be divided into a DMOS transistor region D, a CMOS transistor region C, and a bipolar transistor region B, where the corresponding transistors are formed, and isolation regions I separating the transistor regions. In addition, the CMOS region C is subdivided into a PMOS transistor region P and an NMOS transistor region N.

Figure 2:
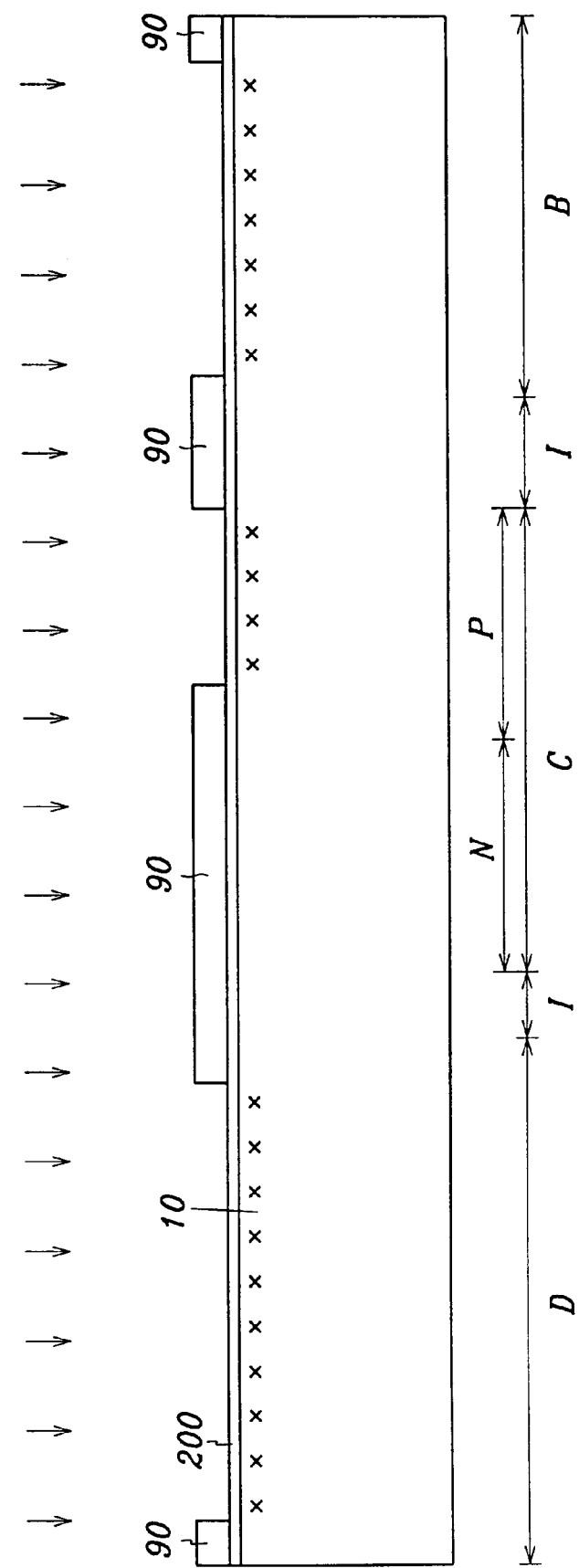
FIG. 2 through FIG. 13 are schematic cross-sections of intermediate structures illustrating a method of manufacturing the semiconductor device according to the preferred method of the present invention.

The first step of the invention is to form the n+ buried diffusion layers as in a conventional device. In the preferred embodiment of the method, this step is illustrated in FIG. 2. A temporary, thin oxide layer 200 is grown on the p type substrate 10. A layer 90 of photoresist is coated on the thin oxide layer 200 formed on the p type substrate, and patterned to expose the portions of the oxide layer 200 in the DMOS region D, the PMOS region P, and the bipolar region B. Then n type ions of $10^{15}$ dose/cm$^2$ are impinged onto the device as represented by the vertical arrows. The n type ions diffuse through portions of the thin oxide layer 200, using the layer of photoresist 90 as an implant mask, and the n type ions are implanted in the p type substrate 10 in regions marked by the crosses (x).

Figure 3:
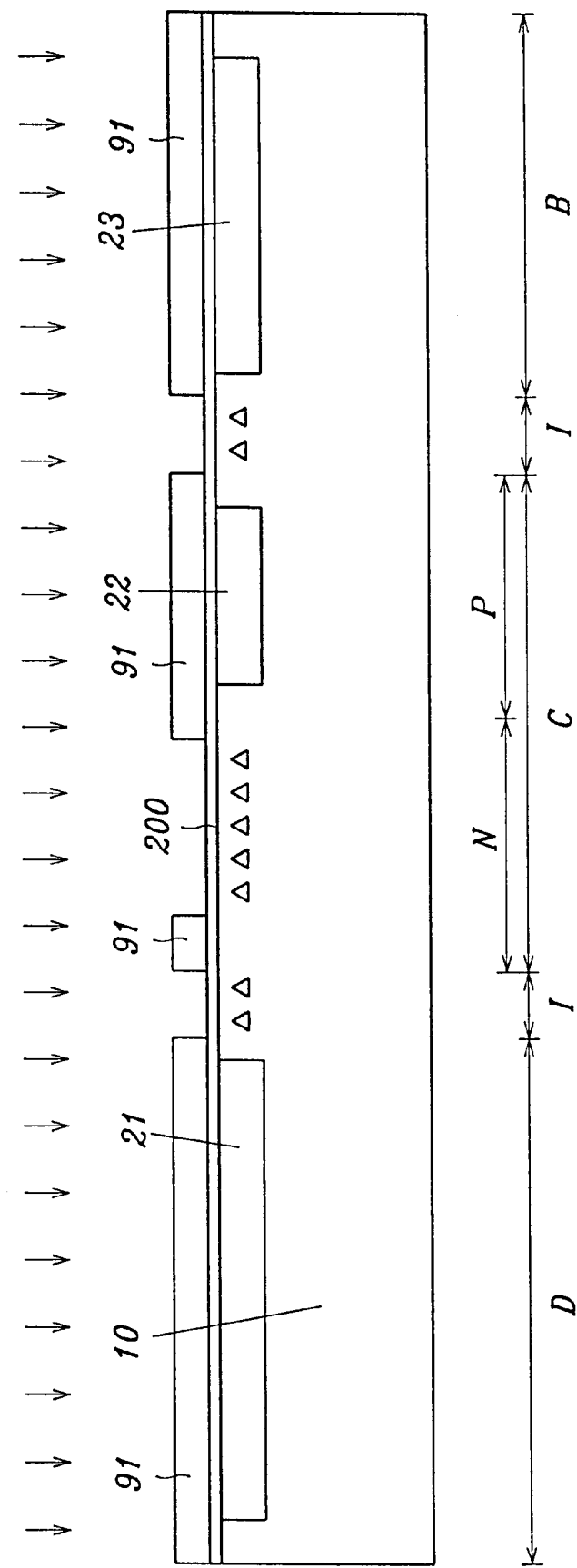

FIG. 3 shows that, after removing the photoresist layer 90, n+ buried diffusion layers 21, 22, 23 are formed where the n+ ions were implanted.

The next step of the invention is to form a p+ buried layer for the NMOS transistor simultaneously with p type layers in the isolation region. The preferred method is illustrated further in FIG. 3. Another photoresist pattern 91 is formed on the thin oxide layer 200. Portions of the oxide layer 200 in the isolation regions I and the NMOS region N are then exposed to p type ions of at least $10^{14}$ dose/cm$^2$ as represented by the vertical arrows. The p type ions diffuse through portions of the thin oxide layer 200, using the layer of photoresist 91 as an implant mask, and the p type ions are implanted in the p type substrate 10 in regions marked by the triangles (Δ).

Figure 4:
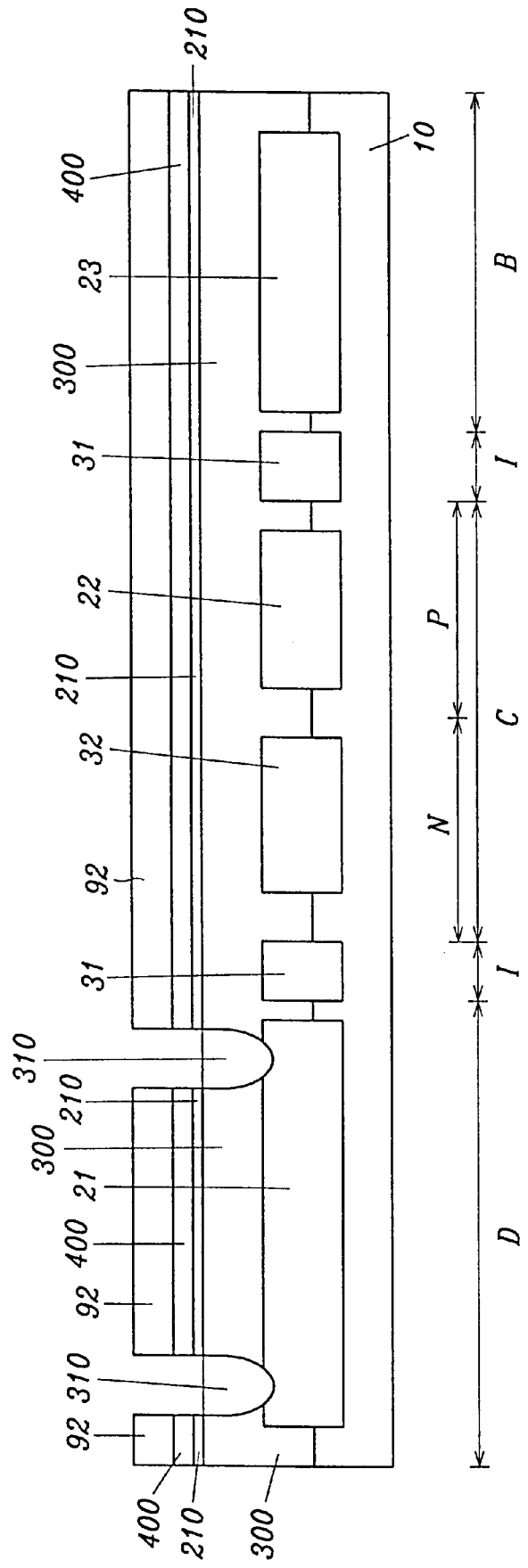

FIG. 4 shows, after removing the photoresist pattern 91, p+ bottom diffusion layers 31 and 32 are formed where the p type ions were implanted.

The next step of the invention is to form an isolation layer within the device substrate simultaneously with formation of other structures in the transistors. The preferred method is illustrated further in FIG. 4 and in FIG. 5 through FIG. 7.

Referring to FIG. 4, after removing the thin oxide layer 200, an n type epitaxial layer 300 is grown which has a thickness in the range from about 6 μm to about 14 μm and an electrical resistivity in the range of about 1.3 Ω-cm to about 2.0 Ω-cm. Another temporary oxide layer 210 having a thickness in the range from about 50 Å to about 1,000 Å is thermally grown on the epitaxial layer 300. Then a nitride layer 400 having a thickness in the range from about 500 Å to about 3,000 Å is deposited on the temporary oxide layer 210. A pattern of photoresist 92 is coated on the nitride layer 400. A portion of the nitride layer 400 and the oxide layer 210 is removed near the edge portions of the DMOS region D to expose the epitaxial layer 300. POCl$_3$ (phosphorus oxychloride) is deposited into the epitaxial layer 300 to form an n+ type sink region 310 surrounding the DMOS region D.

Figure 5:
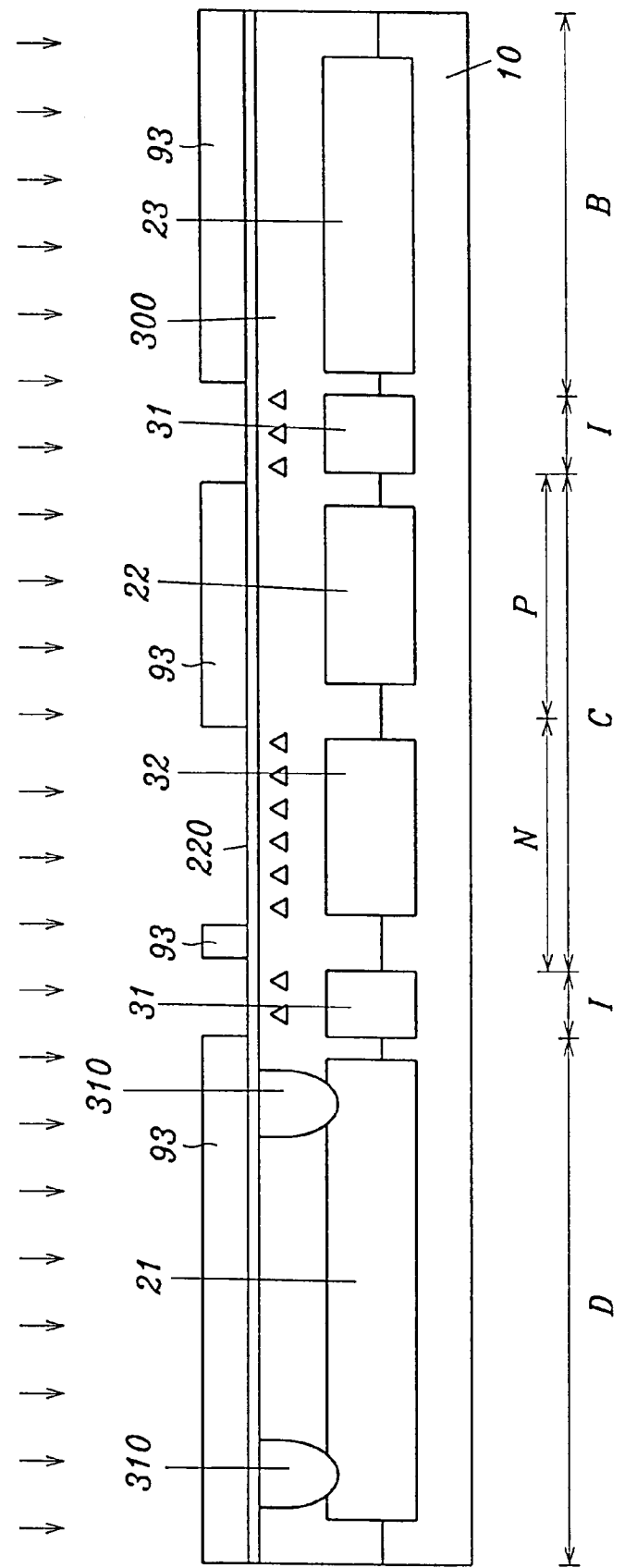

Referring to FIG. 5, the photoresist pattern 92, the nitride layer 400 and the temporary oxide layer 210 are removed, and another oxide layer 220 is grown. A pattern of photoresist 93 is formed on the extant oxide layer 220 such that the portions of the extant oxide layer 220 in the isolation regions I and the NMOS region N are exposed. Then p type ions in the range from about $10^{12}$ dose/cm$^2$ to about $10^{13}$ dose/cm$^2$, as represented by the vertical arrows, are impinged onto the device. The p type ions diffuse through portions of the extant oxide layer 220, using the layer of photoresist 93 as an implant mask, and the p type ions are implanted in the epitaxial layer 300 in regions marked by the triangles (Δ).

Figure 6:
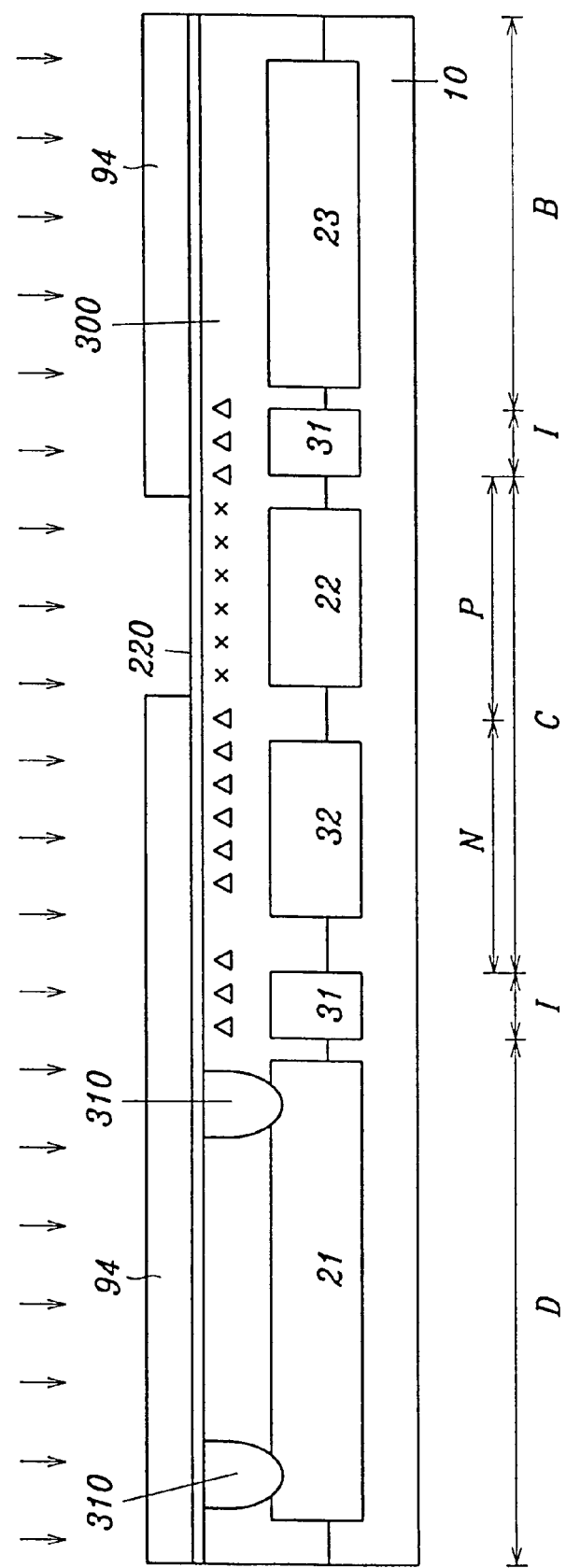

Referring to FIG. 6, after removing the photoresist pattern 93, a new pattern of photoresist 94 is formed on the oxide layer 220 to expose the portion of the oxide layer 220 in the PMOS region P. Then n type ions in the range from about $10^{12}$ dose/cm$^2$ to about $3\times10^{13}$ dose/cm$^2$, as represented by the vertical arrows, are impinged onto the device. The n type ions diffuse through portions of the extant oxide layer 220, using the layer of photoresist 94 as an implant mask, and the n type ions are implanted in the epitaxial layer 300 in regions marked by the crosses (x). The triangles (Δ) represent the p type ions implanted in the epitaxial layer 300 during the previous step.

Figure 7:
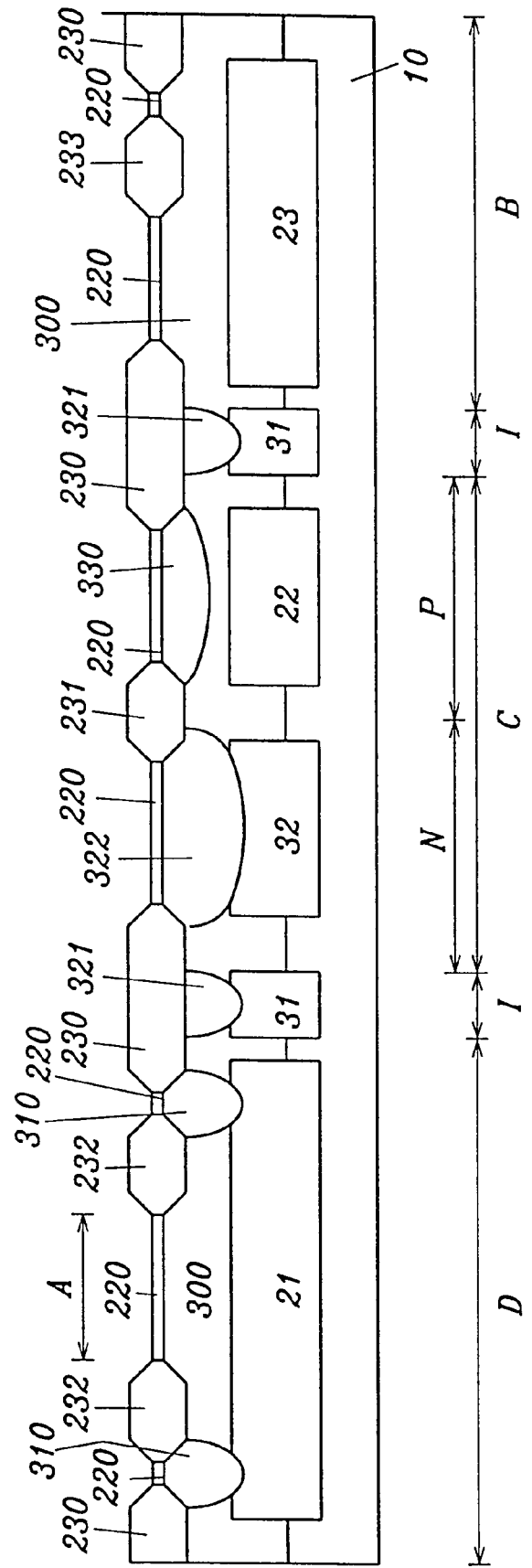

Referring to FIG. 7, after the photoresist pattern 94 is removed, the p type ions implanted in the isolation regions I form isolation diffusion layers 321, the p type ions implanted in the NMOS region N form a p well diffusion layer 322, and the n type ion implanted in the PMOS region P form an n well diffusion layer 330. The term device substrate refers, in the preferred embodiment, to both the epitaxial layer 300 (with its diffusion layers 321, 322, 330 and sink 310) and the underlying p type substrate 10 (with its diffusion layers 21, 22, 23, 31 and 32). The isolation layers 321 formed in this step separate the DMOS region D, the CMOS region C and the bipolar region B from each other. Thus, according to the invention, the isolation layers 321 are within the device substrate in the isolation region I. Note that, in the preferred embodiment, the isolation layers 321 are formed at the same time that the p well 322 is formed for the NMOS transistor.

The next steps of the invention are to form a first oxide layer with a variable thickness, and a thick second oxide layer on the isolation layer. The preferred method is illustrated further in FIG. 7 and in FIG. 8. Referring to FIG. 7, a nitride layer (not shown) is deposited on the extant oxide layer 220. Using photolithography techniques, the nitride layer is patterned to cover the portions of the extant oxide layer 220 on an active area A and on the area over the sink 310 in the DMOS region D, on the areas over the wells 322 and 330 in the CMOS region C, and on two active areas in the bipolar region B. By using a LOCOS (localized oxidation of silicon) method, a thick oxide layer is grown on the oxide layer 220. Thick portions 230, 232, 231 and 233 of the thick oxide layer are formed, respectively, over the isolation layers 321, over the portion of the epitaxial layer 300 between the active region A and the sink region 310 in the DMOS region D, over the portion of the epitaxial layer at the boundary between the NMOS region N and the PMOS region P, and over the middle portion of the epitaxial layer 300 in the bipolar transistor region B. Thereafter, the nitride layer is removed. The thick oxide layer is termed the second oxide layer. The purpose of the thick oxide layer portion 232 is to help increase the withstand voltage of the DMOS transistor, and the purpose of the thick oxide layer portions 230 and 231 is to separate the transistor regions at the surface of the device substrate. Note that both purposes are accomplished at the same time in the same manufacturing step. Thus, according to the invention, a thick second oxide layer increases the withstand voltage of some transistors and electrically isolates the transistors from each other.

Figure 8:
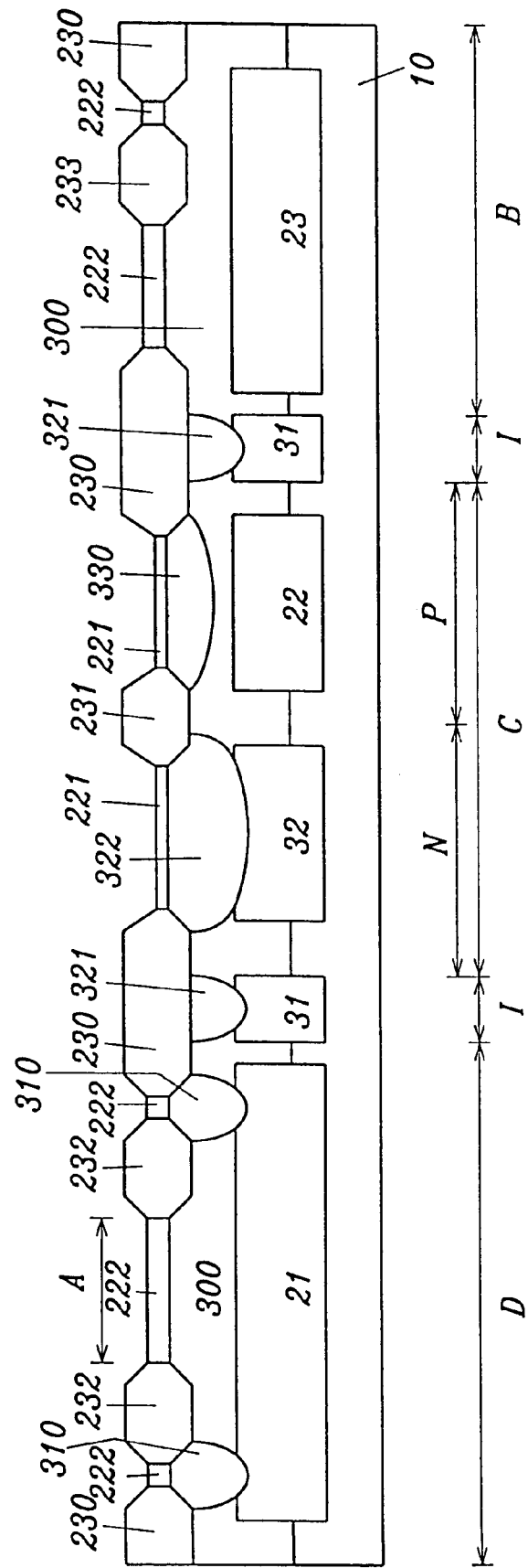

Referring to FIG. 8 and the preferred embodiment, a layer of photoresist (not shown) is formed and patterned to cover the extant oxide layer 220 in the DMOS region D, and optionally patterned to cover the extant oxide layer 220 in the bipolar region B. The exposed portion of the extant oxide layer 220 is removed, exposing the device substrate at least over the p well 322 and the n well 330 in the CMOS region C. Then the photoresist layer is removed. Next, a thermal oxidation process is performed over the whole device, adding to the thickness of the extant oxide layer 220 (in DMOS region D and bipolar region B) and creating a new oxide layer where the extant oxide layer was removed (in CMOS region C). As a result the first oxide layer is completed with a first portion 221 having one thickness and a second portion 222 having a different thickness. Since the second portion 222 of the first oxide layer in the DMOS region is thicker than the first portion 221 of the first oxide layer in the CMOS region, the DMOS transistor has a higher withstand voltage than the CMOS transistor.

In other embodiments of the present invention, by varying the thicknesses of the first oxide layer using similar methods, it is possible to obtain both high voltage transistors and low voltage transistors in the same device and in the same circuit. Since the thickness of the first oxide layer in the bipolar transistor region B does not contribute to the characteristics of the bipolar transistor, it may have the same value as the first portion 221 of the first oxide layer, or the same value as the second portion 222 of the first oxide layer, as shown.

The next steps of the invention are to deposit a polysilicon layer and pattern it for use both as gates in the transistors and as resistive elements in the isolation regions between transistors, and to dope the gate patterns. The preferred method is illustrated in FIG. 9 through FIG. 11.

Figure 9:
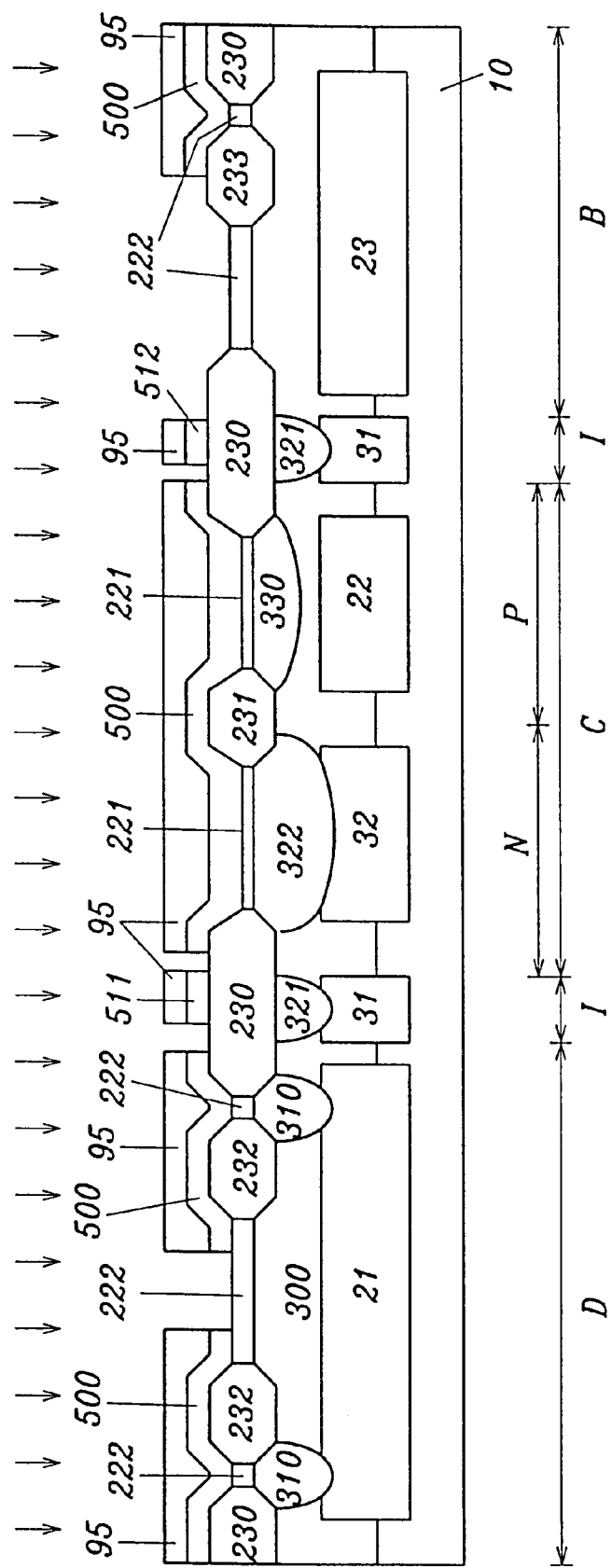

Referring to FIG. 9, a polysilicon layer 500 is deposited with a thickness in the range from about 2,000 Å to about 6,000 Å over the device. A photoresist layer 95 is deposited and patterned using photolithography. The polysilicon layer 500 is etched using the photoresist pattern 95 as a mask to expose portions 222 of the first oxide layer in the DMOS region D and portions 222 of the first oxide layer between the thick second oxide layers 230 and 233 of the bipolar transistor region B. This etching step also exposes the portions 230 of the thick second oxide layer on either side of polysilicon elements 511 and 512. The polysilicon elements 511 and 512 constitute the resistance elements in the isolation regions. Using the photoresist pattern 95 as an implant mask, p type ions in a range from about $10^{13}$ dose/cm$^2$ to about $9\times10^{13}$ dose/cm$^2$ are impinged on the exposed oxide layers, as indicated by the vertical arrows. The p type ions diffuse through the exposed first oxide layer into the epitaxial layer 300 of the DMOS region to form a p type well, and into the bipolar region B to form a p type base. Then the photoresist pattern 95 is removed. FIG. 10 shows the resulting p type well 341 in the DMOS region D, and the p type base 342 of the bipolar region B formed by diffusion.

Figure 10:
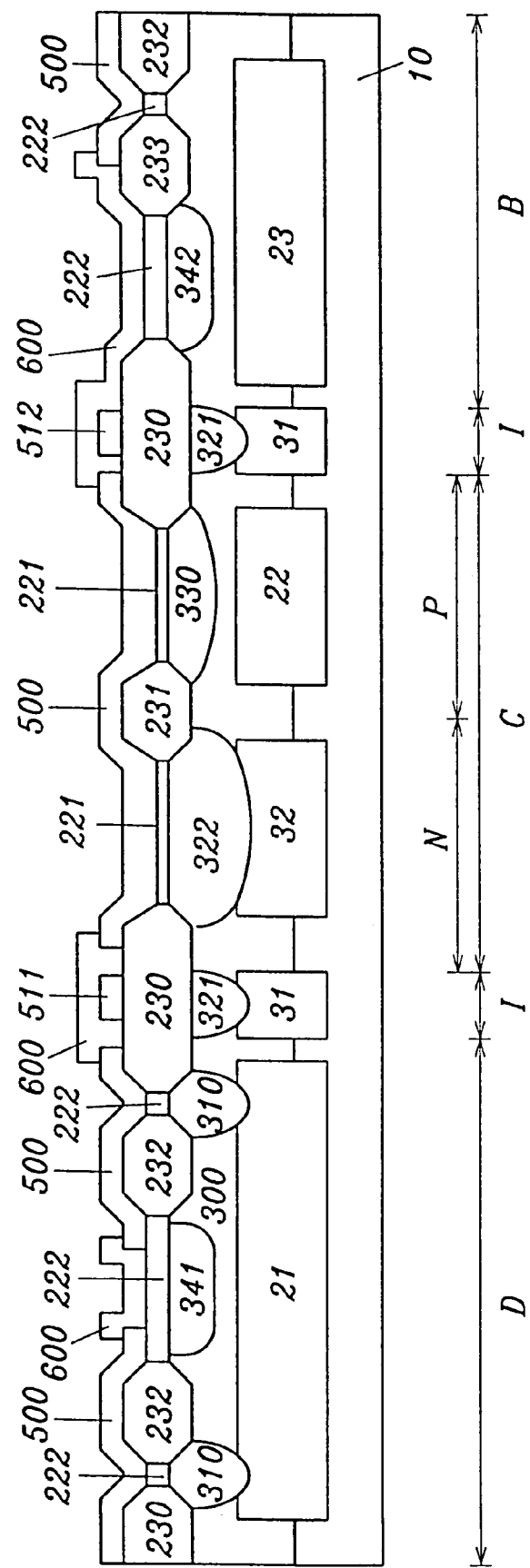

Referring to the preferred method in FIG. 10, a low temperature oxide (LTO) film 600 is next deposited using chemical vapor deposition (CVD). Then, the LTO film 600 is removed except the portions on the p well 341 of the DMOS region D, on the p base 342 of the bipolar region B and on the resistance elements 511, 512. The exposed portions of the polysilicon layer 500 are then highly doped with n type impurities by depositing POCl$_3$. Because the resistance patterns 511, 512 are covered with the LTO film 600, they are not doped. As a result, the resistance elements 511, 512 have lower electron mobility than the doped portion of the polysilicon layer 500, and therefore the resistance elements 511, 512 have high resistance.

Figure 11:
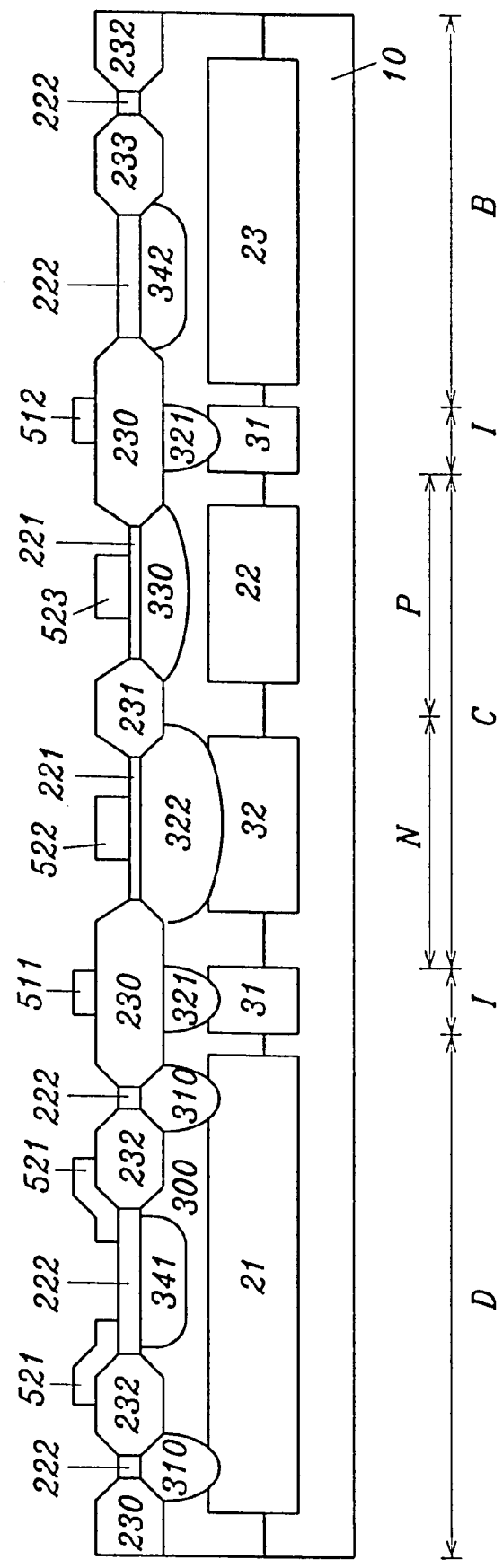

Referring to the preferred method in FIG. 11, the remaining LTO film 600 is then removed. The doped portion of the polysilicon layer 500 is then patterned to form a gate 521 extending from the thick oxide film 232 to the edge of the p well 341 in the DMOS region D, and to form gates 522 and 523 located at the centers of the wells 322 and 330, respectively, in the CMOS region C.

The final steps of the method invention complete the formation of the CMOS, DMOS, and bipolar transistors as in more conventional devices. The preferred embodiment for these steps of the method is illustrated in FIG. 12 through FIG. 14.

Figure 12:
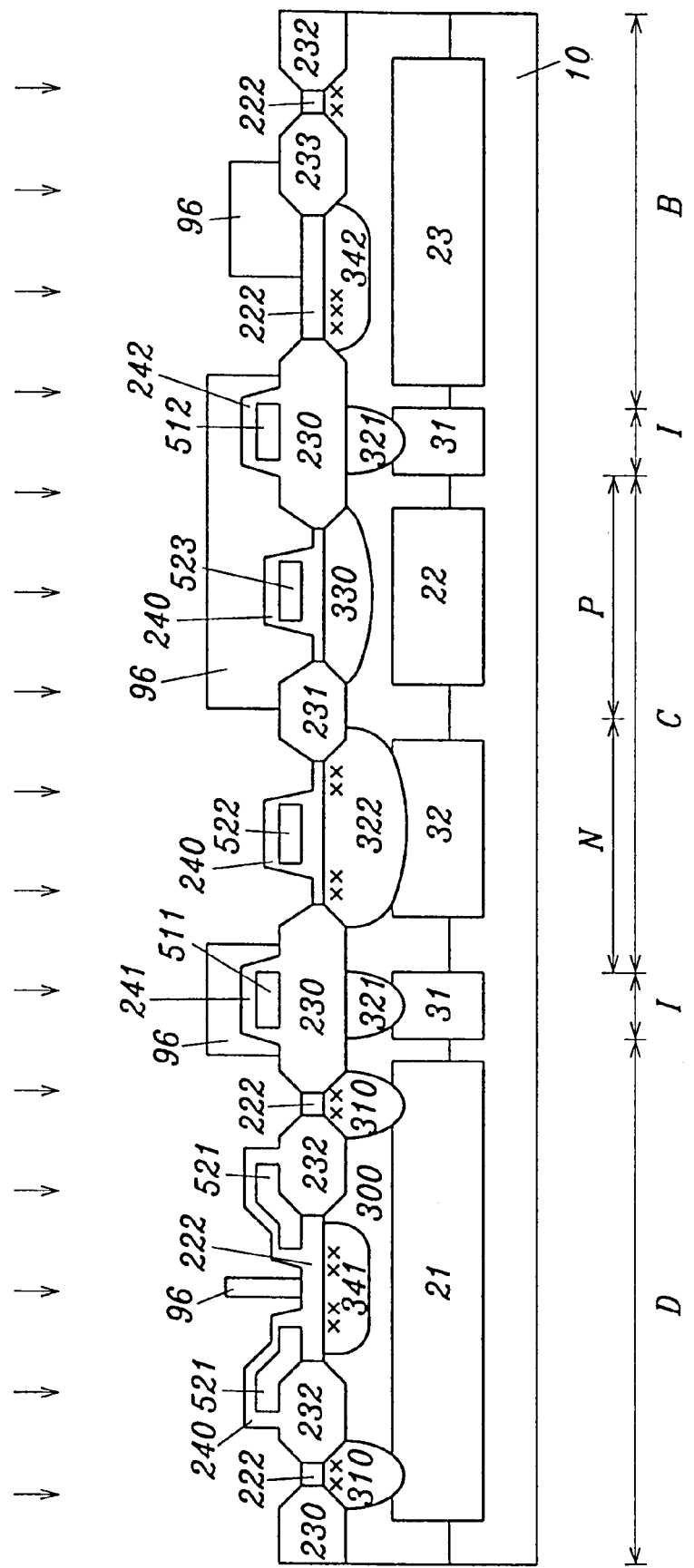

Referring to FIG. 12, thermal oxidation is performed to form oxide layers 240 on the surfaces of the gates 521, 522 and 523, and to form oxide layers 241 and 242 and resistance elements 511 and 512, respectively. A layer of photoresist 96 is formed to cover the center of the second portion 222 of the first oxide layer in the DMOS region D over the p well 341. The photoresist layer 96 also covers the resistance elements 511 and 512, covers the PMOS region P, and covers a part of the p base 342 of the bipolar transistor region B. Then n type ions in the range from about $10^{15}$ dose/cm$^2$ to about $2\times10^{16}$ dose/cm$^2$ as represented by the vertical arrows are impinged on the exposed oxide layers using the photoresist pattern 96 as an implanting mask. The n type ions diffuse into the epitaxial layer 300 at locations indicated by the crosses (x) to form more n type structures of the transistors. The layer 96 of photoresist is then removed. FIG. 13 shows the n type structures formed, including, sources 351 and a drain 352 of the DMOS region D, a source 353 and a drain 354 of the NMOS region N, and an emitter 355 and a collector 356 of the bipolar region B.

Figure 13:
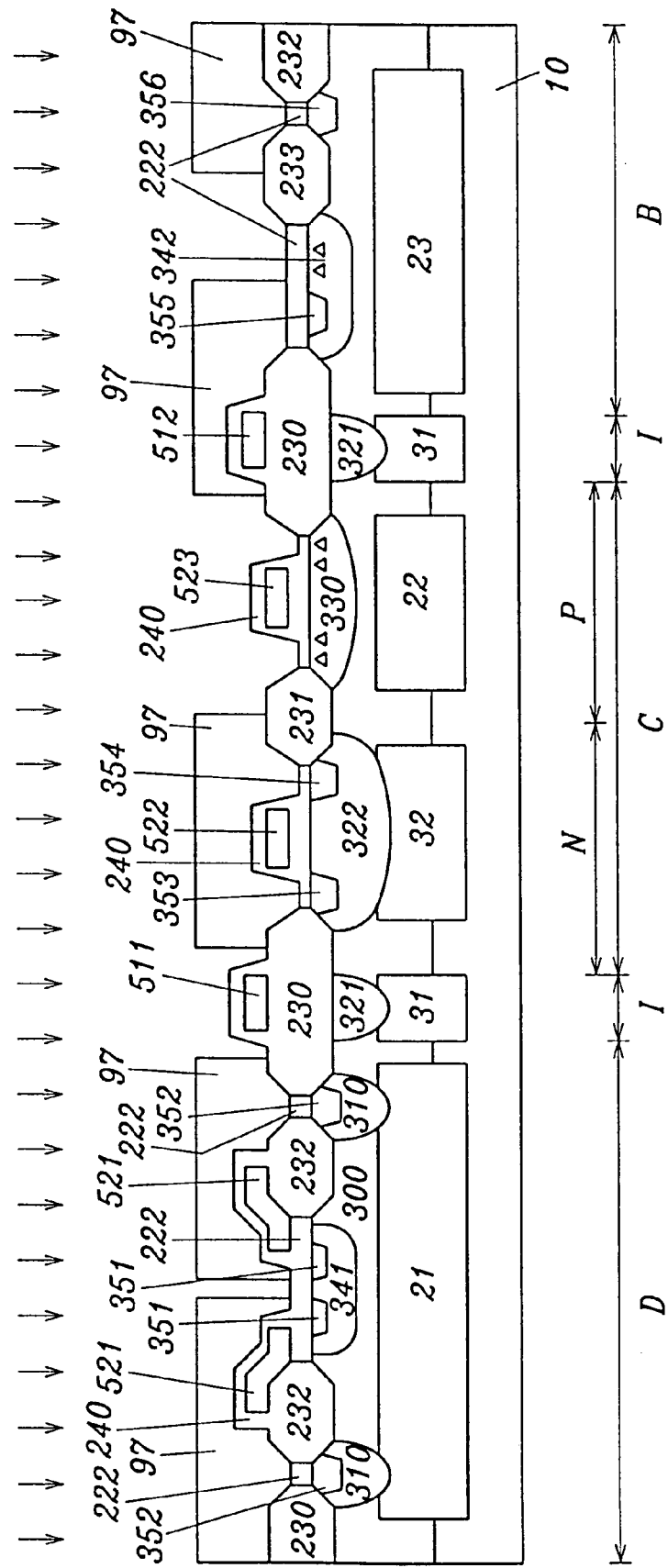

Still referring to the preferred method in FIG. 13, a layer of photoresist 97 is formed to expose the areas covered by the previous photoresist layer 96 (in FIG. 12) except for resistance element 512. That is, the photoresist layer 97 exposes the center of the second portion 222 of the first oxide layer in the DMOS region D over the p well 341, the resistance element 511, the PMOS region P, and a part of the p base 342 of the bipolar transistor region B. Then p type ions in a range from about $10^{15}$ dose/cm$^2$ to about $2\times10^{16}$ dose/cm$^2$ are impinged on the exposed oxide layers, using the photoresist layer 97 as an implant mask. The p type ions diffuse into the epitaxial layer 300 as indicated by the triangles to form p type structures in the transistors. At the same time, one resistance element 511 is doped with p type ions. The layer of photoresist 97 is then removed. FIG. 14 shows the p type structures formed, including, a sub-contact 361 of the DMOS region D, a source 362 and a drain 363 of the PMOS region P, and a base 364 of the bipolar region B.

Figure 14:
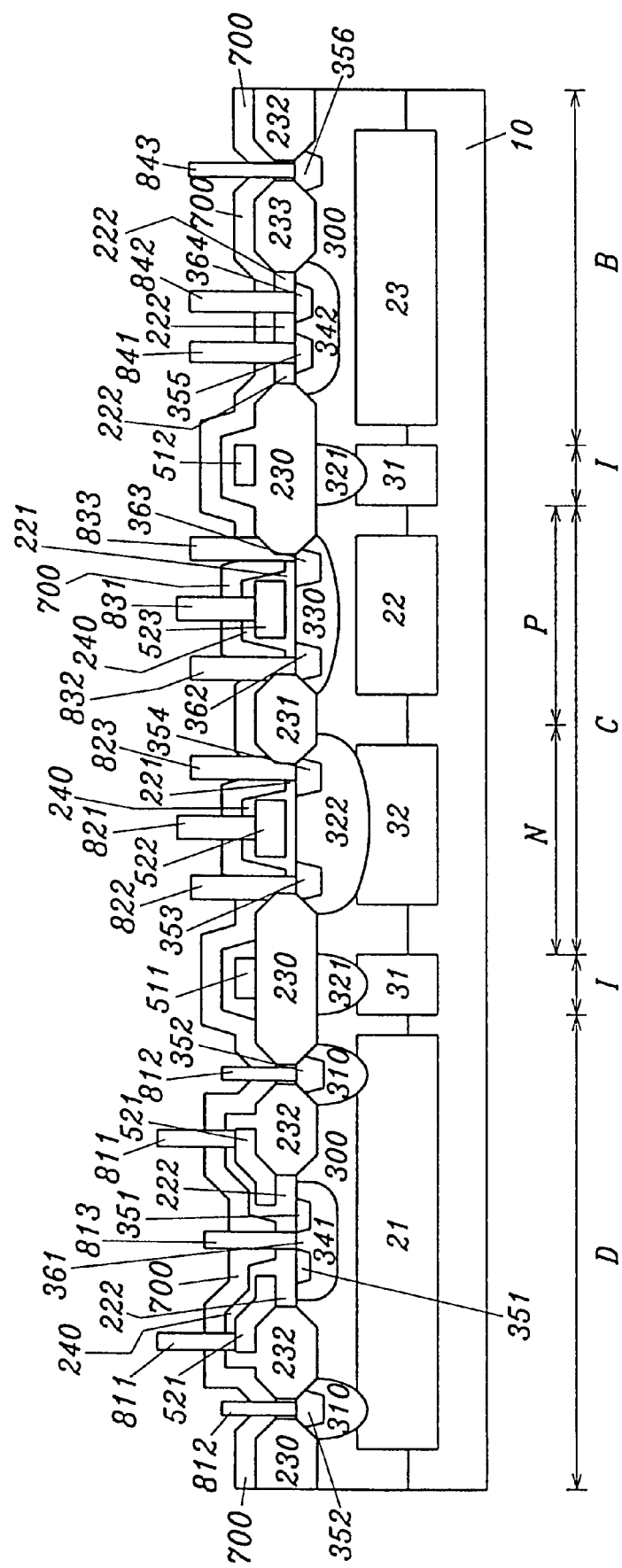
FIG. 14 is a schematic cross section of the preferred embodiment of the device of the present invention.

Still referring to the preferred method in FIG. 14, a LTO film having a thickness in the range from about 2,000 Å to about 10,000 Å is deposited as a protection layer 700. Then contact holes are formed in the protection layer 700 using photolithography. A metal layer is deposited and patterned to form the necessary electrodes. A gate electrode 811, a drain electrode 812, and a source electrode 813 are formed on the gate 521, the drain 352, and the sub-contact 361, respectively, of the DMOS region D. In the CMOS region C, gate electrodes 821 and 831 are formed on the gates 522 and 523, source electrodes 822 and 832 are formed on the sources 353 and 362, and drain electrodes 823 and 833 are formed on the drains 354 and 363, respectively. In the bipolar region an emitter electrode 841, a collector electrode 843, and a base electrode 842 are formed on the emitter 355, the collector 356 and the base 364, respectively.

The invention includes the device fabricated by the method of the invention, and the preferred embodiment of the device is also illustrated in FIG. 14. The invention is a semiconductor device with a DMOS transistor, a CMOS transistor, and a bipolar transistor sharing the same p type substrate 10. The transistors are separated by isolation regions with polysilicon resistance elements 511 or 512, which are formed on thick oxide layers 230, which are formed on isolation layers 321, which are formed on bottom layers 31. In addition, the invention may have another oxide layer of varying thickness in the transistors. The structures of each transistor in the preferred embodiment are described in detail below, referring to FIG. 14.

In the DMOS transistor of the preferred embodiment, a device substrate has an n type epitaxial layer 300 disposed on a p type substrate 10, and an n+ type buried layer 21 disposed between the p type substrate 10 and the epitaxial layer 300. A p type well 341 is disposed in the epitaxial layer 300. An n type source region 351 is disposed in a ring shape in the p type well 341. A p type sub-contact 361, which is more highly doped than the p type well 341, is disposed in the p type well 341, and surrounded by the source region 351. The p type well 341 is surrounded by an n+ sink region 310 which is connected to the buried layer 21. A drain 352 doped with n type ions is disposed in the sink region 310, a thick oxide layer 232 is disposed between the sink region 310 and the p type well 341 on the surface of the epitaxial layer 300. A DMOS gate oxide layer 222 is disposed on the remaining surface of the epitaxial layer 300. A polysilicon gate 521 is disposed on the portion of the gate oxide layer 222 between the source region 351 and the drain region 352, and the gate 521 is covered with an oxide layer 240. A protection layer 700 covers the surface of the oxide layers 222, 232 and 240. A gate electrode 811 is connected to the gate 521 through a contact hole in the protection layer 700 and the oxide layer 240. A source electrode 813 and a drain electrode 812 are connected to the sub-contact 361 and the drain 352, respectively, through contact holes in the protection layer 700 and the oxide layer 222.

The CMOS transistor includes an NMOS transistor and a PMOS transistor separated by an thick oxide layer 231. The preferred embodiment of the NMOS transistor is described first.

A device substrate has an n type epitaxial layer 300 disposed on a p type substrate 10, and a p+ type bottom layer 32 disposed between the p type substrate and the epitaxial layer 300. A p type well 322 is disposed in the epitaxial layer 300, extending from the surface of the epitaxial layer 300 to the p+ type bottom layer 32. An n type source 353 and drain 354 are disposed in the p type well 322. A CMOS gate oxide layer 221 is disposed on the surface of the epitaxial layer 300 between the source 353 and the drain 354. A polysilicon gate 522 covered with an oxide layer 240 is disposed on the gate oxide layer 221. A protection layer 700 covers the oxide layer 240. The source 353, the drain 354 and the gate 522 are connected to metal electrodes 822, 823 and 821, respectively, through contact holes.

The preferred embodiment of the PMOS transistor is described next. A device substrate has an n type epitaxial layer 300 disposed on a p type substrate 10, and an n+ type buried layer 22 disposed between the p type substrate and the epitaxial layer 300. An n type well 330 is disposed in the epitaxial layer 300 on the n+ type buried layer 22. A p type source 362 and a drain 363 are disposed in the n type well 330. A CMOS gate oxide layer 221 is disposed on the surface of the epitaxial layer 300 between the source 362 and the drain 363. A polysilicon gate 523 covered with an oxide layer 240 is disposed on the gate oxide layer 221. A protection layer 700 covers the oxide layer 240. The source 362, the drain 363 and the gate 523 are connected to metal electrodes 832, 833 and 831, respectively, through contact holes.

Since the gate oxide layer 222 of the DMOS transistor is thicker than the gate oxide layer 221 of the CMOS transistor, the DMOS transistor has a relatively high withstand voltage compared to the CMOS transistor.

Finally, the preferred embodiment of the NPN bipolar transistor is described. A device substrate has an n type epitaxial layer 300 disposed on a p type substrate 10, and an n+ buried layer 23 disposed between the p type substrate and the epitaxial layer 300. A p type base 342 is disposed in the epitaxial layer 300, an n type emitter 355 and p+ type base 364 are disposed in the p type base 342. An n type collector 356 is disposed in the epitaxial layer 300. The collector 356 and the p type base 342 are separated by a portion 233 of a thick oxide layer disposed on the surface of the epitaxial layer 300. An oxide layer 222 is disposed on the surface of the epitaxial layer 300 between portions 230, 232 and 233 of the thick oxide layer. A protection layer 700 covers the oxide layer 222. The emitter 355, the p+ type base 364 and the collector 356 are connected to metal electrodes 841, 842 and 843, respectively, through contact holes in the oxide layer 222 and the protection layer 700.

With the method of the present invention, it is possible to simplify the manufacturing process, and to form simultaneously, and on the same device substrate, a CMOS transistor and a bipolar transistor having a low operating voltage with a DMOS transistor having a high withstand voltage on a single substrate.

In the drawings and specification, there have been disclosed typical preferred embodiments of the invention and, although specific terms are employed, they are used in a generic and descriptive sense only and not for purposes of limitation. It will be apparent to those skilled in the art that various other modifications and variations can be made in the semiconductor device and the method of manufacturing of the present invention without departing from the spirit or scope of the invention. Thus, it is intended that the present invention cover the modifications and variations of this invention provided they come within the scope of the appended claims and their equivalents.

What is claimed is:

1. A method of manufacturing a semiconductor device containing a DMOS transistor, a CMOS transistor and a bipolar transistor in a single substrate, comprising the steps of:

forming an isolation layer within the substrate in a plurality of isolation regions between each of a DMOS region, a CMOS region, and a bipolar region;

forming a discontinuous first oxide layer of variable thickness on the substrate, excluding the isolation regions;

forming a second oxide layer on the isolation layer;

depositing a polysilicon layer on the first oxide layer and on the second oxide layer;

patterning the polysilicon layer to form gate patterns on the first oxide layer and resistive patterns on the second oxide layer; and doping the gate patterns.

2. The method of claim 1, wherein the thickness of the first portion of the first oxide layer in the DMOS region is greater than the thickness of the second portion of the first oxide layer in the CMOS region.

3. The method of claim 1, the step of forming the first oxide layer comprising the steps of:

removing portions of an extant oxide film on the surface of the substrate in the CMOS region; and performing an oxidation process over all regions for forming the first oxide layer with a greater thickness in the DMOS region than in the CMOS region.

4. The method of claim 1, the step of doping comprising the steps of:

depositing a third oxide layer over the gate patterns and resistive patterns;

removing a portion of the third oxide layer overlying the gate patterns;

infusing the polysilicon layer with a dopant in the gate patterns using the third oxide layer as a mask; and removing the third oxide layer.

5. The method of claim 1, wherein the polysilicon layer has a thickness in the range from about 2,000 Å to about 6,000 Å.

6. A method of manufacturing a semiconductor having a DMOS transistor, a CMOS transistor, and a bipolar transistor in a single substrate, comprising:

forming an isolation layer within the substrate in a plurality of isolation regions between each of a DMOS region, a CMOS region, and a bipolar region;

depositing a first oxide layer over the substrate;

depositing a nitrite layer over the substrate, the nitrite layer including a first portion, formed over the isolation regions, and a second portion;

removing the first portion of the nitride layer;

forming a second oxide layer for isolation over the isolation regions by oxidation;

removing the second portion of the nitride layer;

removing a portion of the first oxide layer in the CMOS region;

forming a third oxide layer over the substrate;

depositing a polysilicon layer over the third oxide layer;

patterning the polysilicon layer to form gate patterns in the CMOS region and resistive patterns in the isolation regions; and doping the gate patterns.

7. The method of claim 6, wherein the polysilicon layer is an undoped layer.

8. The method of claim 6, wherein a step of doping the gate patterns comprises:

depositing a fourth oxide layer over the gate patterns and the resistive patterns;

removing a portion of the fourth oxide layer overlaying the gate patterns;

infusing the polysilicon layer with a dopant in the gate patterns using the fourth oxide layer as an implant mask; and removing the fourth oxide layer.

9. The method of claim 8, further comprising doping portions of the DMOS region, the CMOS region, and the bipolar region with an n-type dopant.

10. The method of claim 9, further comprising doping portions of the DMOS region, the CMOS region, the bipolar region, and the resistive pattern located in the isolation region proximate to the DMOS region with a p-type dopant.

* * * * *